United States Patent
Basu et al.

(10) Patent No.: US 10,319,636 B2
(45) Date of Patent: Jun. 11, 2019

(54) DEPOSITION AND TREATMENT OF FILMS FOR PATTERNING

(71) Applicant: Applied Materials, Inc., Santa Clara, CA (US)

(72) Inventors: Atashi Basu, Menlo Park, CA (US); Abhijit Basu Mallick, Palo Alto, CA (US); Ziqing Duan, San Jose, CA (US); Srinivas Gandikota, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 15/801,949

(22) Filed: Nov. 2, 2017

(65) Prior Publication Data

US 2018/0144980 A1    May 24, 2018

Related U.S. Application Data

(60) Provisional application No. 62/416,992, filed on Nov. 3, 2016.

(51) Int. Cl.
| | |
|---|---|
| *H01L 21/02* | (2006.01) |
| *H01L 21/033* | (2006.01) |
| *H01L 21/266* | (2006.01) |
| *H01L 21/762* | (2006.01) |
| *H01L 21/768* | (2006.01) |
| *H01L 21/3213* | (2006.01) |

(52) U.S. Cl.
CPC .. *H01L 21/76897* (2013.01); *H01L 21/02244* (2013.01); *H01L 21/02247* (2013.01); *H01L 21/0332* (2013.01); *H01L 21/0335* (2013.01); *H01L 21/32133* (2013.01); *H01L 21/76227* (2013.01); *H01L 21/266* (2013.01)

(58) Field of Classification Search
CPC ......... H01L 21/76805; H01L 21/02247; H01L 21/76227; H01L 29/6653; H01L 45/683
See application file for complete search history.

(56) References Cited

U.S. PATENT DOCUMENTS

| | | | |
|---|---|---|---|
| 8,338,225 B2 | 12/2012 | Breitwisch et al. | |
| 8,575,753 B2 | 11/2013 | Choi et al. | |
| 9,362,413 B2 | 6/2016 | Yu et al. | |
| 2003/0143862 A1 | 7/2003 | Iyer | |
| 2008/0242097 A1* | 10/2008 | Boescke | C30B 25/04 |
| | | | 438/703 |
| 2010/0078617 A1* | 4/2010 | Breitwisch | H01L 45/06 |
| | | | 257/3 |
| 2012/0115302 A1 | 5/2012 | Breitwisch et al. | |
| 2014/0264747 A1* | 9/2014 | Barabash | H01L 28/60 |
| | | | 257/532 |
| 2015/0137113 A1 | 5/2015 | Yu et al. | |
| 2016/0068710 A1 | 3/2016 | Wang et al. | |
| 2016/0260779 A1* | 9/2016 | Kawashima | H01L 27/2481 |
| 2017/0338149 A1* | 11/2017 | Lin | H01L 21/76879 |

OTHER PUBLICATIONS

PCT International Search Report and Written Opinion in PCT/US2017/059737 dated May 18, 2018, 11 pages.

* cited by examiner

*Primary Examiner* — Jaehwan Oh
*Assistant Examiner* — John M Parker
(74) *Attorney, Agent, or Firm* — Servilla Whitney LLC

(57) ABSTRACT

Methods comprising depositing a film material to form an initial film in a trench in a substrate surface are described. The film is treated to expand the film to grow beyond the substrate surface.

16 Claims, 7 Drawing Sheets

DEPOSITION AND TREATMENT OF FILMS FOR PATTERNING

CROSS-REFERENCE TO RELATED APPLICATIONS

This application claims priority to U.S. Provisional Application No. 62/416,992, filed Nov. 3, 2016, the entire disclosure of which is hereby incorporated by reference herein.

TECHNICAL FIELD

The present disclosure relates generally to methods of depositing and processing thin films. In particular, the disclosure relates to processes for filling trenches in substrates.

BACKGROUND

The semiconductor industry is rapidly developing chips with smaller and smaller transistor dimensions to gain more functionality per unit area. As the dimensions of devices continue to shrink, so does the gap/space between the devices, increasing the difficulty to physically isolate the devices from one another. Filling in the high aspect ratio trenches/spaces/gaps between devices which are often irregularly shaped with high-quality dielectric materials is becoming an increasing challenge to implementation with existing methods including gapfill, hardmasks and spacer applications. Selective deposition methods typically include depositing a mask material on a substrate and patterning the mask material to form a patterned mask. Regions of the substrate may then be exposed though the patterned mask after the patterning of the mask. The patterned mask may be removed from the substrate to expose non-implanted regions of the substrate and a material may be selectively deposited on selected regions of the substrate.

There is a need in the art for new methods for chip designs with smaller critical dimensions. Additionally, there is an ongoing need for high quality metal oxide films for hardmasks and spacer applications, as well as methods for forming patterned films on substrates.

SUMMARY

One or more embodiments of the disclosure are directed to processing methods. One embodiment pertains to providing a substrate surface having at least one trench, the at least one trench extending a depth from the substrate surface to a bottom surface, the at least one trench having a width defined by a first sidewall and a second sidewall, selectively depositing a film material to form an initial film having a film material volume in the trench and not on the substrate surface, the film material having a Pilling-Bedworth ratio of greater than 2 and comprises a material selected from the group consisting of Co, Cr, Fe, Mn, Nb, Os, Ta, U, W and V. The method of the one embodiment further includes treating the initial film to expand the film material volume to provide an expanded film which extends beyond the substrate surface. Treating the initial film may include exposing the initial film to an oxidizing environment or a nitridating environment.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

Before describing several exemplary embodiments of the disclosure, it is to be understood that the disclosure is not limited to the details of construction or process steps set forth in the following description. The disclosure is capable of other embodiments and of being practiced or being carried out in various ways.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal, UV cure, e-beam cure and/or bake the substrate surface. In addition to film processing directly on the surface of the substrate itself, in the present disclosure, any of the film processing steps disclosed may also be performed on an underlayer formed on the substrate as disclosed in more detail below, and the term "substrate surface" is intended to include such underlayer as the context indicates. Thus for example, where a film/layer or partial film/layer has been deposited onto a substrate surface, the exposed surface of the newly deposited film/layer becomes the substrate surface.

One or more embodiments of the disclosure are directed to methods for depositing metal oxide films for any conformal, nonconformal and/or low to high aspect ratio gap/trench/void filling applications. Embodiments of the disclosure advantageously provide methods of depositing a film (e.g., a metal oxide film) in high aspect ratio (AR) structures with small dimensions. Some embodiments of the disclosure advantageously provide methods of filling gaps without formation of a seam in the gap. One or more embodiments of the disclosure advantageously provide methods of forming self-aligned vias.

Figure 1:
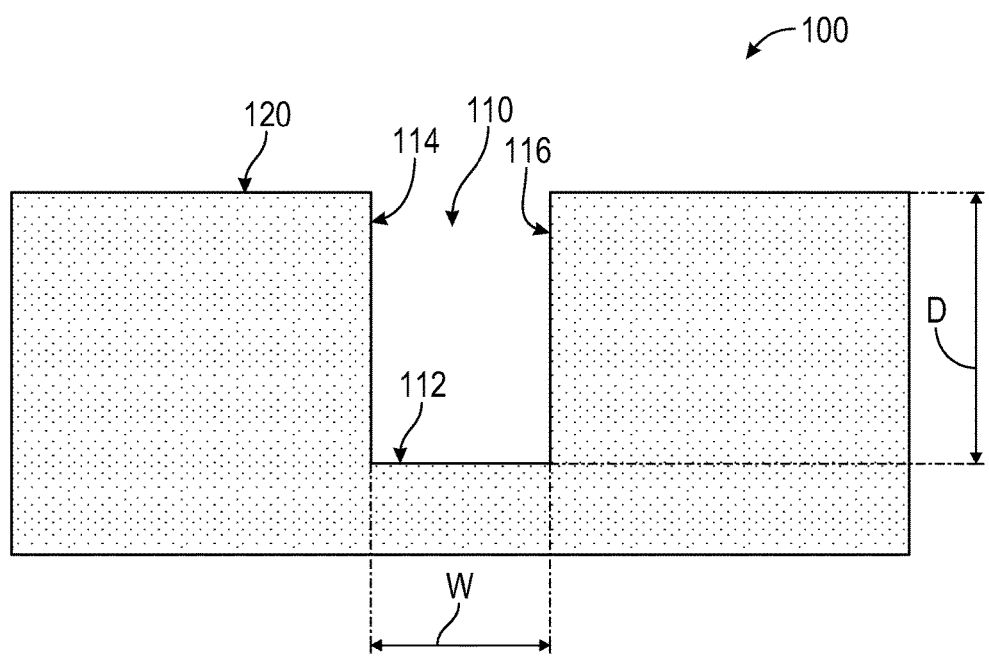
FIG. 1 shows a cross-sectional view of a substrate feature in accordance with one or more embodiments of the disclosure.

FIG. 1 shows a partial cross-sectional view of a substrate 100 with a feature 110. The Figures show substrates having a single feature for illustrative purposes; however, those skilled in the art will understand that there can be more than one feature. The shape of the feature 110 can be any suitable shape including, but not limited to, trenches and cylindrical vias. In specific embodiments, the feature 110 is a trench. As used in this regard, the term "feature" means any intentional surface irregularity. Suitable examples of features include, but are not limited to trenches which have a top, two sidewalls and a bottom, peaks which have a top and two sidewalls extending upward from a surface and vias which have sidewalls extending down from a surface with an open bottom. Features or trenches can have any suitable aspect ratio (ratio of the depth of the feature to the width of the feature). In some embodiments, the aspect ratio is greater than or equal to about 5:1, 10:1, 15:1, 20:1, 25:1, 30:1, 35:1 or 40:1.

The substrate 100 has a substrate surface 120. The at least one feature 110 forms an opening in the substrate surface 120. The feature 110 extends from the substrate surface 120 to a depth D to a bottom surface 112. The feature 110 has a first sidewall 114 and a second sidewall 116 that define a width W of the feature 110. The open area formed by the sidewalls and bottom are also referred to as a gap.

Figure 2A:
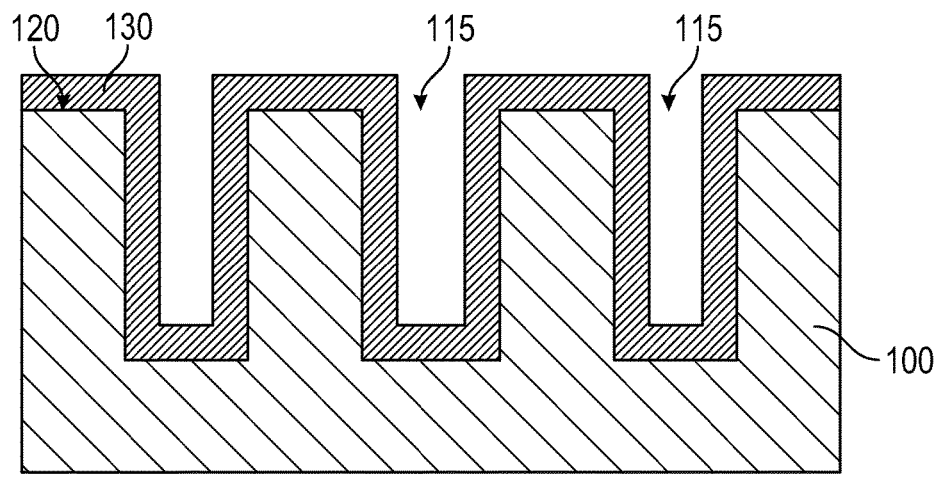
FIGS. 2A and 2B show a cross-sectional schematic of a gapfill process in accordance with one or more embodiments of the disclosure.
Figure 2B:
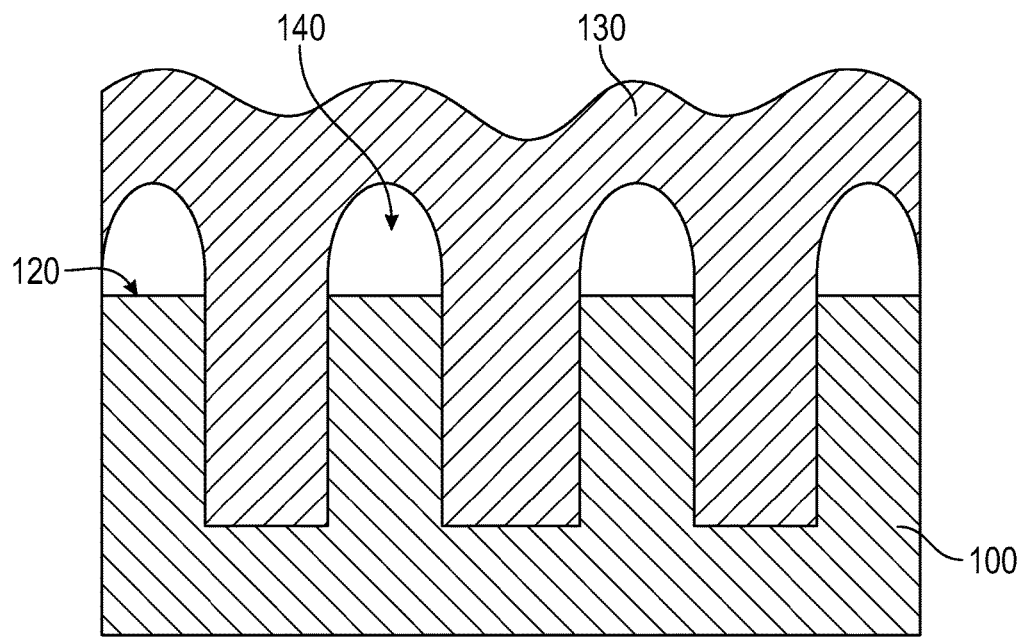

With reference to FIGS. 2A through 2B, the substrate 100 is provided for processing. As used in this regard, the term "provided" means that the substrate is placed into a position or environment for further processing.

A film 130 is formed on the substrate surface 120 and the walls and bottom of the feature 110. The film 130 can be any suitable film formed by any suitable process including, but not limited to, chemical vapor deposition, plasma-enhanced chemical vapor deposition, atomic layer deposition, plasma-enhanced atomic layer deposition and/or physical vapor deposition. In some embodiments, the film 130 is formed by atomic layer deposition or plasma-enhanced atomic layer deposition.

In some embodiments, the film 130 is a metal film or a metal-containing film. Suitable metal films include, but are not limited to metals having a Pilling-Bedworth ratio greater than 2, greater than 2.25, or greater than 2.5. Pilling-Bedworth ratio refers to a ratio of a volume of the elementary cell of a metal oxide or metal nitride to the volume of the elementary cell of the corresponding metal from which the oxide or nitride is formed. The Pilling-Bedworth ratio is defined as the $V_{oxide}/V_{metal}$ or $V_{nitride}/N_{metal}$, where V is volume. For determining the Pilling-Bedworth ratio of a metal oxide, $V_{oxide}$ equals the molecular mass of the of the metal oxide multiplied by the density of the metal, and $V_{metal}$ equals the number of atoms of metal per one molecule of the oxide multiplied by the atomic mass of the metal multiplied by the density of the oxide. For determining the Pilling-Bedworth ratio of a metal nitride, $V_{nitride}$ equals the molecular mass of the of the metal nitride multiplied by the density of the metal, and $V_{metal}$ equals the number of atoms of metal per one molecule of the nitride multiplied by the atomic mass of the metal multiplied by the density of the nitride. Examples of such films include one or more of Co, Mo, W, Ta, Ti, Ru, Rh, Cu, Fe, Mn, V, Nb, Hf, Zr, Y, Al, Sn, Cr, Os, U and/or La. In some embodiments, the metal is selected from the group consisting of Co, Fe, Mn, Nb, Os, Ta, U, and V. In some embodiments, the metal has a Pilling-Bedworth ratio of greater than 2.5 and is selected from the group consisting of Mo, Os, and V. In some specific embodiments, the metal film comprises tungsten. In some specific embodiments, the metal film excludes tungsten. Suitable metal containing films include derivatives of a metal film. Suitable derivatives of the metal film include, but are not limited to, nitride, boride, carbide, oxynitride, oxyboride, oxycarbide, carbonitride, borocarbide, boronitride, borocarbonitride, borooxycarbonitride, oxycarbonitride, borooxycarbide and borooxynitride. Those skilled in the art will understand that the metal film deposited may have a non-stoichiometric amount of atoms with the metal film. For example, a film designated as WN may have different amounts of tungsten and nitrogen. The WN film may be, for example, 90 atomic % tungsten. The use of WN to describe a tungsten nitride film means that the film comprises tungsten and nitrogen atoms and should not be taken as limiting the film to a specific composition. In some embodiments, the film consists essentially of the designated atoms. For example, a film consisting essentially of WN means that the composition of the film is greater than or equal to about 95%, 98% or 99% tungsten and nitrogen atoms. In some embodiments, the film 130 comprises tungsten. In some embodiments, the film 130 consists essentially of tungsten. In one or more embodiments, the film comprises titanium. In some embodiments, the film consists essentially of titanium or titanium nitride.

In some embodiments, the film 130 forms conformally on the at least one feature 110. As used herein, the term "conformal", or "conformally", refers to a layer that adheres to and uniformly covers exposed surfaces with a thickness having a variation of less than 1% relative to the average thickness of the film. For example, a 1,000 Å thick film would have less than 10 Å variations in thickness. This thickness and variation includes edges, corners, sides, and the bottom of recesses. For example, a conformal layer deposited by ALD in various embodiments of the disclosure would provide coverage over the deposited region of essentially uniform thickness on complex surfaces.

In some embodiments, the film 130 is a continuous film. As used herein, the term "continuous" refers to a layer that covers an entire exposed surface without gaps or bare spots that reveal material underlying the deposited layer. A continuous layer may have gaps or bare spots with a surface area less than about 1% of the total surface area of the film.

In some embodiments, the film 130 is formed substantially seamlessly within the feature 110. In some embodiments, a seam 115 may be formed within the width W of the feature 110. The seam 115 can be any gap, space or void that forms between the walls 114, 116 of the feature 110

The film 130 can then be expanded to cause volumetric expansion to fill the feature and allow the film 130 to extend from the feature. As shown in FIG. 2B, expanding the film causes a volumetric expansion of the original film 130 to fill the feature. The expansion of the film 130 can be in the range of about 10% to about 1000%, or in the range of about 50% to about 800%, or in the range of about 100% to about 700%. In some embodiments, the film 130 expands by an amount greater than or equal to about 150%, 200%, 250%, 300% or 350%. In some embodiments, the film 130 expands an amount in the range of about 300% to about 400%. As shown in FIG. 2B, the expansion of the film 130 causes the seam 115 to become filled.

In some embodiments, the film 130 is expanded by exposure to an oxidizing agent or oxidizing conditions to convert the metal or metal containing film to a metal oxide film. The oxidizing agent can be any suitable oxidizing agent including, but not limited to, $O_2$, $O_3$, $N_2O$, $H_2O$, $H_2O_2$, CO, $CO_2$, $NH_3$, $N_2$/Ar, $N_2$/He, $N_2$/Ar/He and combinations thereof. In some embodiments, the oxidizing conditions comprise a thermal oxidation, plasma enhanced oxidation, remote plasma oxidation, microwave and radio-frequency (e.g., ICP, CCP).

In some embodiments, the film 130 is expanded by exposure to a nitridation agent or nitridation conditions to convert the metal or metal containing film to a metal nitride film. The nitridation agent can be any suitable nitridation agent including, but not limited to, ammonia, hydrazine, $NO_2$, $N_2$/Ar plasma, $N_2$/He plasma, $N_2$/Ar/He plasma and combinations thereof. In some embodiments, the nitridation conditions comprise a thermal nitridation, plasma enhanced nitridation, remote plasma nitridation, microwave and radio-frequency (e.g., ICP, CCP).

In some embodiments, the film 130 is expanded by exposure to a siliciding agent or siliciding conditions to convert the metal or metal containing film to a metal silicide film. The siliciding agent can be any suitable siliciding agent including, but not limited to, silane, disilane, trisilane, tetrasilane, pentasilane, hexasilane, trimethyl silane, compounds with trimethylsilyl substituents and combinations thereof. In some embodiments, the siliciding conditions comprise a thermal siliciding, plasma enhanced siliciding, remote plasma siliciding, microwave and radio-frequency (e.g., ICP, CCP).

In some embodiments, the film 130 is expanded by exposure to a germanium agent or germaniciding conditions to convert the metal or metal containing film to a metal germanicide film. The germaniciding agent can be any suitable germaniciding agent including, but not limited to, germane, digermane, trigermane, tetragermane, pentagermane, hexagermane, trimethyl germanium, compounds with trimethylgermanyl substituents and combinations thereof. In some embodiments, the germaniciding conditions comprise a thermal germaniciding, plasma enhanced germaniciding, remote plasma germaniciding, microwave and radio-frequency (e.g., ICP, CCP).

Treating the film or expansion of the film 130 can occur at any suitable temperature depending on, for example, the composition of the film and the expanding agent. In some embodiments, the film expansion occurs at a temperature in the range of about 25° C. to about 1100° C. In some embodiments, expansion occurs at a temperature greater than or equal to about 250° C., 300° C., 350° C., 400° C., 450° C., 500° C. or 550° C.

In some embodiments, the film 130 is deposited to a thickness in the range of about 25 Å to about 200 Å, or in the range of about 50 Å to about 150 Å. In one or more embodiments, the film 130 is deposited to a thickness of about 50 Å and there is substantially no seam formed in the film. The formation of the seam occurs where the thickness of the film closes on the top part of the feature 110 before the feature is filled with the film. In some embodiments, the substrate surface has a film with a seam between the sidewalls of the at least one feature. As used in this regard, the term "between" means that there is some film on either side of the seam between the seam and the sidewall of the feature. The seam is not limited to being exactly in the center of the sidewalls.

During expansion of the film 130 by, for example, oxidation, a gap 140 is formed on top of the substrate surface 120. The gap 140 can have contents that match the oxidation environment or can be of a different composition. For example, an oxidation environment using nitrogen plasma may form a gap 140 with a nitrogen environment. The expansion agent can have effect the size and content of the gap 140. For example, if a nitridation agent is used to expand the film, the gap 140 may include nitrogen.

Figure 3:
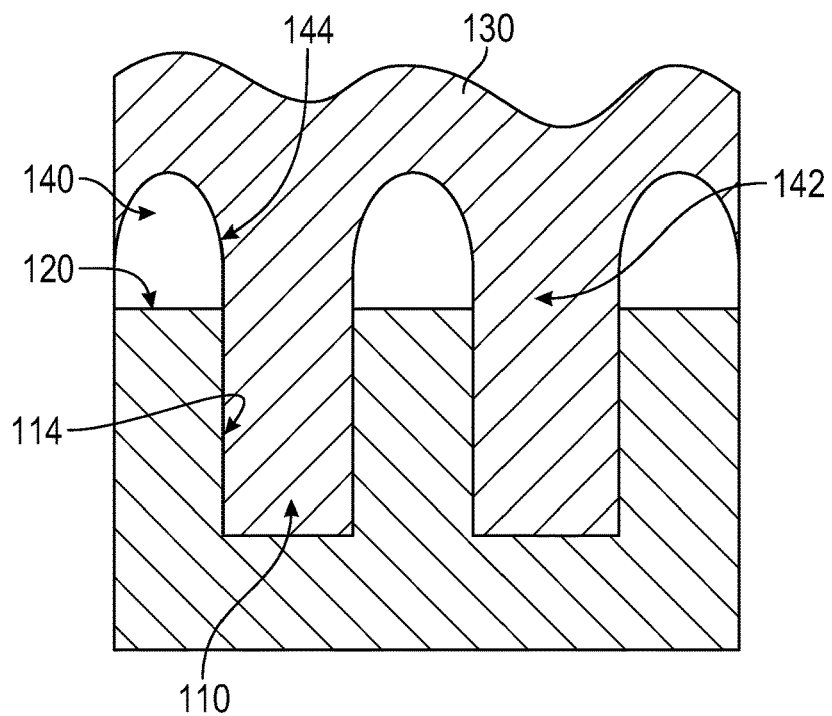
FIG. 3 shows a cross-sectional view of an oxidized film in accordance with one or more embodiments of the disclosure.

As shown in FIG. 3, during expansion, the fidelity of the feature shape is maintained on the top of the feature so that the film 130 grows straight up from the feature 110. As used in this regard, "straight up" means that the film forms a surface 144 around the gap 140 and that the portion of the surface 144 adjacent the feature sidewall 114 is substantially coplanar with the sidewall 114. A surface 144 is coplanar with the sidewall 114 where the angle formed at the junction of the sidewall 114 and the surface 144 is ±10°. Expansion of this sort was expected to grow isotropically to form mushroom shaped top. The expansion of the film 130 to form a straight segment 142 was unexpected.

In some embodiments, the film 130 is doped with a dopant prior to expansion. The dopant can be incorporated into the film 130 at the same time as the formation of the film 130 or in a separate process sequentially with the film deposition. For example, depositing the film 130 may occur followed by doping the film 130 with the dopant in a separate process in either the same process chamber or a different process chamber. In some embodiments, the deposition of the film 130 occurs with the doping in a single process. For example, the film precursor and dopant can be co-flowed into the processing chamber to form the film 130.

Some embodiments include an optional treatment process. The treatment process treats the film 130 to improve some parameter of the film. In some embodiments, the treatment process comprises annealing the film. In some embodiments, treatment can be performed by in-situ anneal in the same process chamber used for deposition and/or reduction. Suitable annealing processes include, but are not limited to, rapid thermal processing (RTP) or rapid thermal anneal (RTA), spike anneal, or UV cure, or e-beam cure and/or laser anneal. The anneal temperature can be in the range of about 500° C. to 900° C. The composition of the environment during anneal may include one or more of H2, Ar, He, N2, NH3, SiH4, etc. The pressure during anneal can be in the range of about 100 mTorr to about 1 atm.

Figure 4:
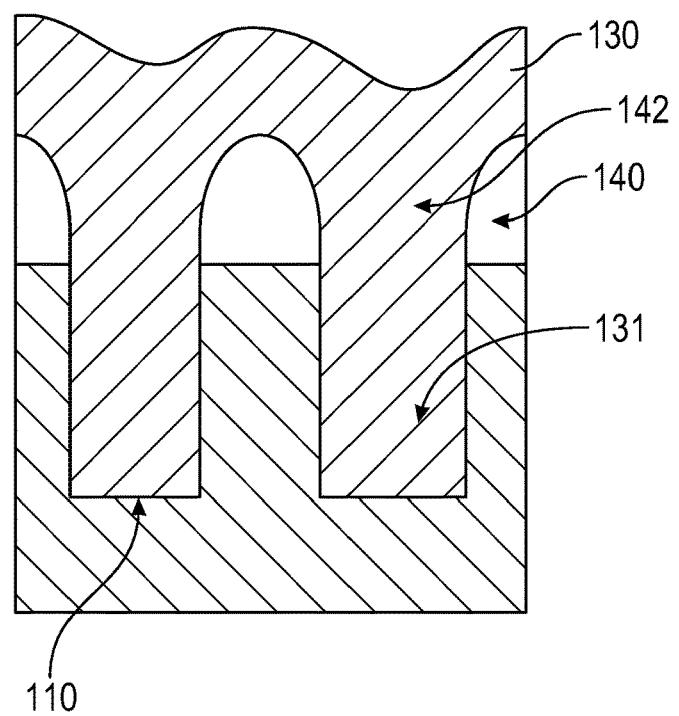
FIG. 4 shows a cross-sectional view of an oxidized film in accordance with one or more embodiments of the disclosure.
Figure 5A:
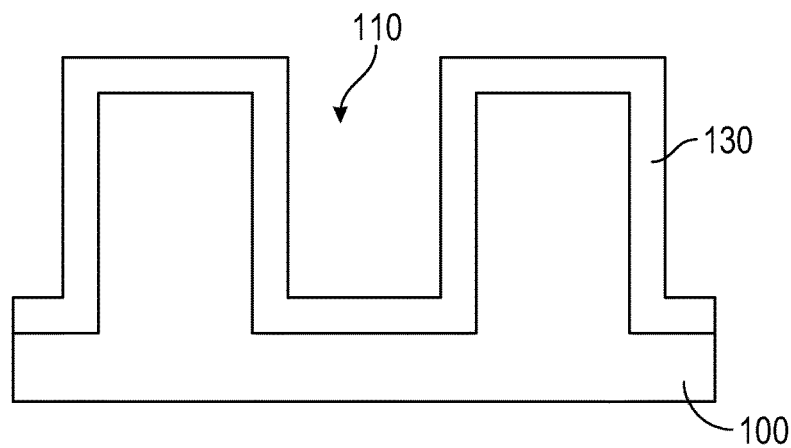
FIGS. 5A through 5C show a cross-sectional schematic of a process in accordance with one or more embodiments of the disclosure.
Figure 5B:
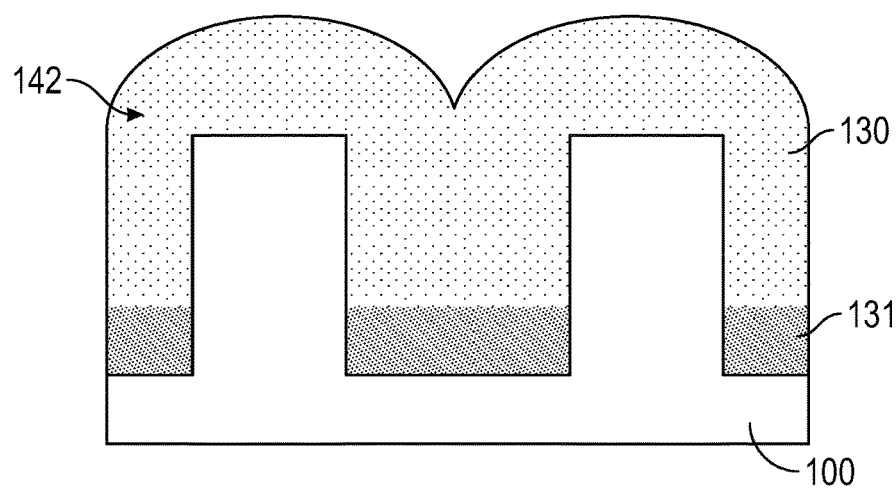
Figure 5C:
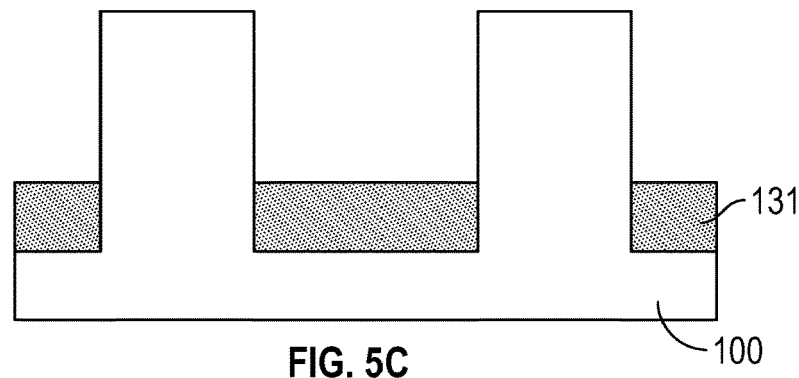

While processes may be referred to as oxidation, those skilled in the art will understand that the disclosure is not limited to oxidation reactions to expand the film. The use of the oxidation reaction to describe various embodiments is for convenience only and is not limiting of the scope of the disclosure. Referring to FIG. 4, in some embodiments there is a greater amount of oxidation at the top portion (the straight segment 142) than at the bottom portion 131 of the feature 110. In some embodiments, there is little or no oxidation of the film 130 at the bottom portion 131 of the feature 110. FIGS. 5A through 5C show a method of depositing a film in a bottom of a feature 110m for example, a trench. The film 130 is deposited by any suitable technique. For example, in FIG. 5A a tungsten film can be deposited on the substrate by atomic layer deposition. The film 130 in FIG. 5B has been oxidized and expanded to fill the feature 110. The top portion 142 of the film 130 comprises an oxide of the deposited metal (e.g., tungsten oxide) and the bottom portion 131 of the film 130 remains unoxidized (e.g., tungsten metal). The difference between the top portion 142 and the bottom portion 131 can be used to selectively etch material from the substrate. As shown in FIG. 5C, if the film 130 is deposited to an etch process selective for oxides, the oxide film at the top portion 142 can be removed leaving the metal film at the bottom portion 131.

Figure 6A:
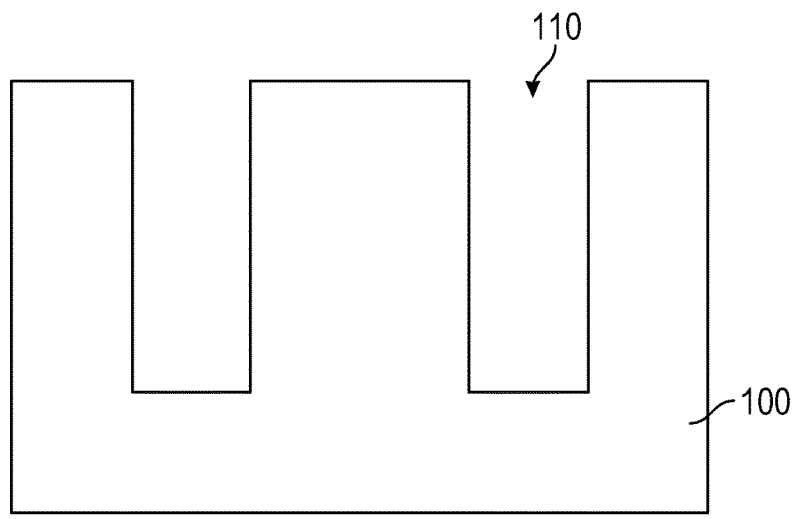
FIGS. 6A through 6C show a cross-sectional schematic of a process in accordance with one or more embodiments of the disclosure.
Figure 6B:
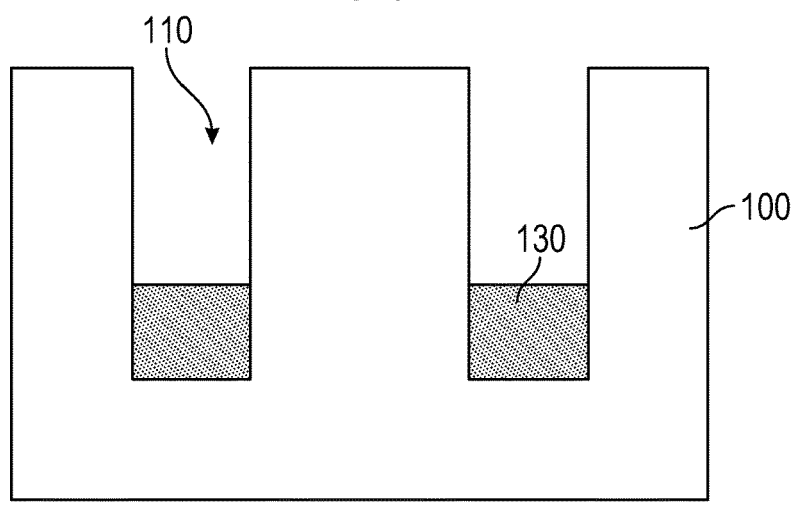
Figure 6C:
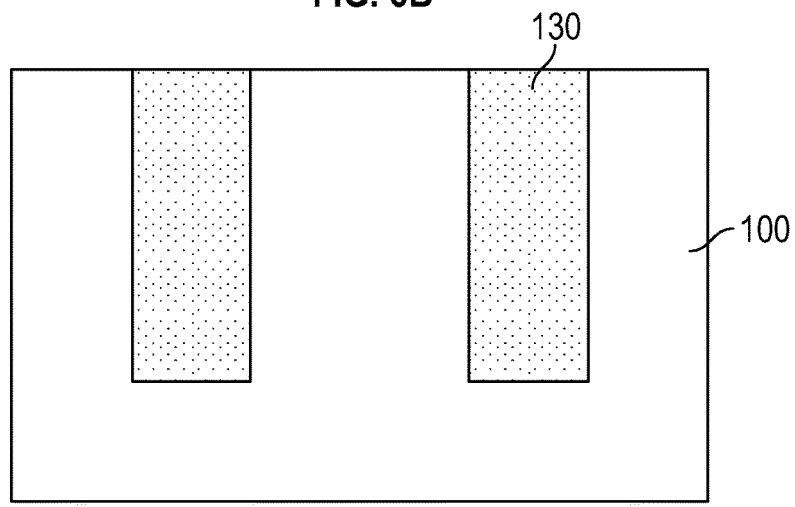

FIGS. 6A through 6C show another embodiment of the disclosure. In FIG. 6A, a substrate 100 with at least one feature (for example, a trench) 110 is shown. A metal film 130 is deposited in the bottom of the feature 110, as shown in FIG. 6B. The film 130 can be oxidized, in FIG. 6C, so that the film expands to fill the feature 110.

Figure 7A:
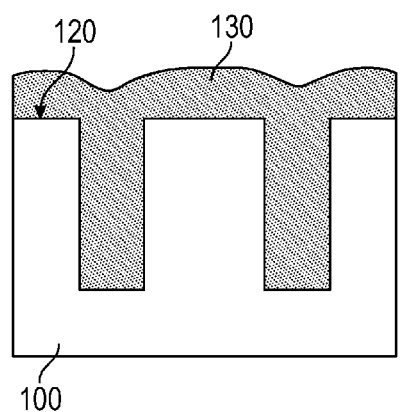
FIGS. 7A through 7D show a cross-sectional schematic of a process in accordance with one or more embodiments of the disclosure.
Figure 7B:
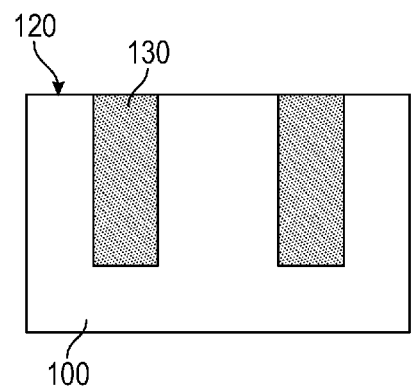
Figure 7C:
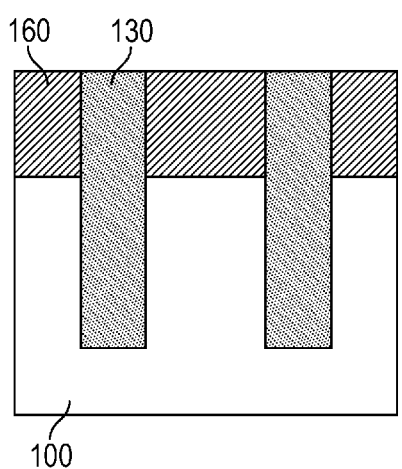
Figure 7D:
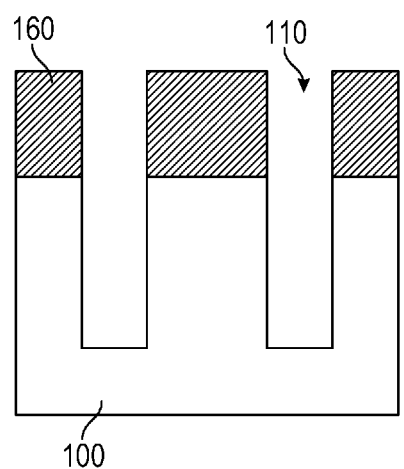

FIGS. 7A through 7D show another embodiment of the disclosure in which a self-aligned via is formed. In FIG. 7A, a substrate with an oxidized film 130 is provided. A polishing or etch process can be performed to remove the top of the film 130 from the surface 120 of the substrate 100, as shown in FIG. 7B. The film 130 remains within and filling the features 110. As shown in FIG. 7C, the film 130 can then be oxidized to cause upward growth the film 130. The sides of the film 130 remain substantially coplanar with the sides of the feature 110 so that there are pillars extending from the features 110. A material layer 160 is deposited on the surface 120 of the substrate 100. As shown in FIG. 7D, the film 130 can be removed (e.g., by etching) to leave the features 110 with the material layer 160 aligned on top of the features 110.

Figure 8A:
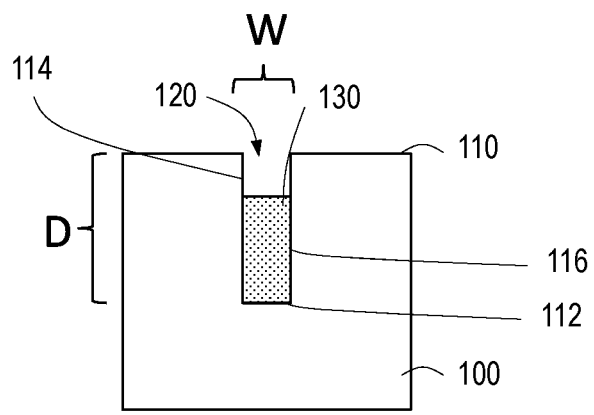
FIGS. 8A through 8B show a cross-sectional schematic of a process in accordance with one or more embodiments of the disclosure.
Figure 8B:
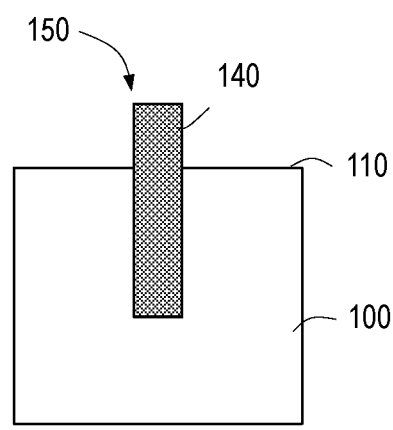

Referring now to FIGS. 8A and 8B, another embodiment in which a processing method includes providing substrate 100 having a surface 110 including at least one feature 120 in the form of a trench, extending a depth "D" from the substrate surface 110 to a bottom surface 112. The trench 120, has a width "W" defined by a first sidewall 114 and a second sidewall 116. According to the embodiment shown, the processing method includes selectively depositing a film material to form an initial film 130 having a film material volume in the trench 120 and not on the substrate surface 110, the film material having a Pilling-Bedworth ratio of greater than 2 and comprises a material selected from the group consisting of Co, Cr, Fe, Mn, Nb, Os, Ta, U, W and V. The processing method further comprises treating the initial film 130 to expand the film material volume to provide an expanded film 140 which extends beyond the substrate surface 110. In one embodiment, the initial film 130, fills at least 10% of the volume of the trench. In other embodiments, the initial film 130 fills at least 15%, 20%, 25%, 30%, 35%, 40%, 45%, 50%, 55%, 60%, 65%, 70%, 75%, 80%, 85%, 90%, 95% or 100% of the volume of the trench. In the embodiment shown, the initial film extends from the first sidewall 114 to the second sidewall. In one or more embodiments, treating the initial film results in the film volume increasing by at least 10%, 20%, 30%, 40%, 50%, 60%, 70%, 80%, 90%, 100%, 150%, 200%, 250%, 300%, 350% or 400%. As shown in FIG. 8B, the expanded film 140 forms a pillar 150 extending from the trench 120. When a plurality of trenches 120 (not shown) are filled with a metal having a Pilling-Bedworth ratio exceeding about 2 and treated to expand the initial film volume, a plurality of pillars 150 can be formed to provide a pattern without using a mask.

In a specific embodiment, the film material is selected from the group consisting of Co, Fe, Mn, Nb, Os, Ta, U, and V. In one embodiment, treating the initial film comprises exposing the initial film to an oxidizing environment, In embodiments in which treating the initial film comprises exposing the initial film to an oxidizing environment the expanded film comprises a material selected from the group consisting of CoO, $Fe_2O_3$, $Fe_3O_4$, $MnO_2$, $Mn_2O_3$, $Mn_3O_4$, $MoO_3$, $Nb_2O_5$, $Ta_2O_5$, $OsO_2$, $UO_2$, and $V_2O_5$.

In some embodiments, the film material has a Pilling-Bedworth ratio of greater than 2.5 and is selected from the group consisting of Mo, Os, and V. In some embodiments in which the, the film material has a Pilling-Bedworth ratio of greater than 2.5 and is selected from the group consisting of Mo, Os, and V treating the initial film comprises exposing the initial film to an oxidizing environment. In such embodiments, the expanded film comprises a material selected from the group consisting of $MoO_3$, $OsO_2$ and $V_2O_5$.

In some embodiments, treating the initial film comprises exposing the initial film to a nitridating environment. In embodiments in which the initial film is exposed to a nitridating environment, the film material is selected from the group consisting of Cr, Mo and Os. In such embodiments, the expanded film comprises a material selected from the group consisting of $CrN_2$, $MoN_2$ and $OsN_2$. In other embodiments in which nitridating the initial film occurs, the Pilling Bedworth ratio is greater than 1.5, and the film material for the initial film is a metal selected from the group consisting of Cr, Mo, OS, Co, Cu, Nb, NI, Rh, Sr, Ta, Ru and W.

In some embodiments, treating the initial film comprises exposing the initial film to an oxidizing agent comprising one or more of $O_2$, $O_3$, $N_2O$, $H_2O$, $H_2O_2$, CO, $CO_2$, $NH_3$, $N_2$/Ar, $N_2$/He or $N_2$/Ar/He and/or a nitridation agent comprising one or more of ammonia, hydrazine, $NO_2$ or nitrogen plasma.

In some embodiments, treating the initial film occurs at a temperature less than about 300° C. or less than 450° C.

Another embodiment pertains to a processing method comprising providing a substrate surface having at least one trench, the at least one trench extending a depth from the substrate surface to a bottom surface, the at least one trench having a width defined by a first sidewall and a second sidewall; selectively depositing a film material to form an initial film having a film material volume in the trench and not on the substrate surface, the film material having a Pilling-Bedworth ratio of greater than 2 and comprising a material selected from the group consisting of Co, Cr, Fe, Mn, Nb, Os, Ta, U, W and V; and treating the initial film to form a nitride of a metal selected from the group consisting of Co, Cr, Fe, Mn, Nb, Os, Ta, U, W or V to expand the film material volume to provide an expanded film which extends beyond the substrate surface. In a specific embodiment, the film material comprises a metal selected from the group consisting of Cr, Mo and Os, and the expanded film comprises a material selected from the group consisting of $CrN_2$, $MoN_2$ and $OsN_2$.

Another embodiment pertains to a processing method comprising providing a substrate surface having at least one trench, the at least one trench extending a depth from the substrate surface to a bottom surface, the at least one trench having a width defined by a first sidewall and a second sidewall; selectively depositing a film material to form an initial film having a film material volume in the trench and not on the substrate surface, the film material having a Pilling-Bedworth ratio of greater than 2 and comprising a material selected from the group consisting of Co, Cr, Fe, Mn, Nb, Os, Ta, U, andV; and treating the initial film to form a oxide of a metal selected from the group consisting of Co, Cr, Fe, Mn, Nb, Os, Ta, U, or V to expand the film material volume to provide an expanded film which extends beyond the substrate surface. In specific embodiments, the film material comprises a metal selected from the group consisting of Co, Fe, Mn, Nb, Os, Ta, U, and V, and the expanded film comprises a material selected from the group consisting of $MoO_3$, $OsO_2$ and $V_2O_5$. In a specific embodiment, treating the initial film occurs at a temperature greater than about 400° C. In a specific embodiment, treating the initial film occurs at a temperature greater than about 350° C.

The oxidation reactions of the embodiments shown in FIGS. 4 through 8B can be nitridation reactions, siliciding reactions or germaniciding reactions. Those skilled in the art will understand that other processes and reactions may be used to expand the film within the feature or cause straight up growth of the film.

According to one or more embodiments, the substrate is subjected to processing prior to and/or after forming the layer. This processing can be performed in the same chamber or in one or more separate processing chambers. In some embodiments, the substrate is moved from the first chamber to a separate, second chamber for further processing. The substrate can be moved directly from the first chamber to the separate processing chamber, or it can be moved from the first chamber to one or more transfer chambers, and then moved to the separate processing chamber. Accordingly, the processing apparatus may comprise multiple chambers in communication with a transfer station. An apparatus of this sort may be referred to as a "cluster tool" or "clustered system," and the like.

Generally, a cluster tool is a modular system comprising multiple chambers which perform various functions including substrate center-finding and orientation, degassing, annealing, deposition and/or etching. According to one or more embodiments, a cluster tool includes at least a first chamber and a central transfer chamber. The central transfer chamber may house a robot that can shuttle substrates between and among processing chambers and load lock chambers. The transfer chamber is typically maintained at a vacuum condition and provides an intermediate stage for shuttling substrates from one chamber to another and/or to a load lock chamber positioned at a front end of the cluster tool. Two well-known cluster tools which may be adapted for the present invention are the Centura® and the Endura®, both available from Applied Materials, Inc., of Santa Clara, Calif. However, the exact arrangement and combination of chambers may be altered for purposes of performing specific steps of a process as described herein. Other processing chambers which may be used include, but are not limited to, cyclical layer deposition (CLD), atomic layer deposition (ALD), chemical vapor deposition (CVD), physical vapor deposition (PVD), etch, pre-clean, chemical clean, thermal treatment such as RTP, plasma nitridation, degas, orientation, hydroxylation and other substrate processes. By carrying out processes in a chamber on a cluster tool, surface contamination of the substrate with atmospheric impurities can be avoided without oxidation prior to depositing a subsequent film.

According to one or more embodiments, the substrate is continuously under vacuum or "load lock" conditions, and is not exposed to ambient air when being moved from one chamber to the next. The transfer chambers are thus under vacuum and are "pumped down" under vacuum pressure. Inert gases may be present in the processing chambers or the transfer chambers. In some embodiments, an inert gas is used as a purge gas to remove some or all of the reactants. According to one or more embodiments, a purge gas is injected at the exit of the deposition chamber to prevent reactants from moving from the deposition chamber to the transfer chamber and/or additional processing chamber. Thus, the flow of inert gas forms a curtain at the exit of the chamber.

The substrate can be processed in single substrate deposition chambers, where a single substrate is loaded, processed and unloaded before another substrate is processed. The substrate can also be processed in a continuous manner, similar to a conveyer system, in which multiple substrate are individually loaded into a first part of the chamber, move through the chamber and are unloaded from a second part of the chamber. The shape of the chamber and associated conveyer system can form a straight path or curved path. Additionally, the processing chamber may be a carousel in which multiple substrates are moved about a central axis and are exposed to deposition, etch, annealing, cleaning, etc. processes throughout the carousel path.

During processing, the substrate can be heated or cooled. Such heating or cooling can be accomplished by any suitable means including, but not limited to, changing the temperature of the substrate support and flowing heated or cooled gases to the substrate surface. In some embodiments, the substrate support includes a heater/cooler which can be controlled to change the substrate temperature conductively. In one or more embodiments, the gases (either reactive gases or inert gases) being employed are heated or cooled to locally change the substrate temperature. In some embodiments, a heater/cooler is positioned within the chamber adjacent the substrate surface to convectively change the substrate temperature.

The substrate can also be stationary or rotated during processing. A rotating substrate can be rotated continuously or in discreet steps. For example, a substrate may be rotated throughout the entire process, or the substrate can be rotated by a small amount between exposures to different reactive or purge gases. Rotating the substrate during processing (either continuously or in steps) may help produce a more uniform deposition or etch by minimizing the effect of, for example, local variability in gas flow geometries.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A processing method comprising:
providing a substrate surface having at least one trench, the at least one trench extending a depth from the substrate surface to a bottom surface, the at least one trench having a width defined by a first sidewall and a second sidewall;
selectively depositing a film material to form an initial film having a film material volume in the trench and not on the substrate surface, the film material having a Pilling-Bedworth ratio of greater than 2 and comprising a material selected from the group consisting of Cr, Mo and Os; and treating the initial film to expand the film material volume to provide an expanded film which extends beyond the substrate surface comprises exposing the initial film to a nitridating environment.

2. The method of claim 1, wherein the film material is selected from the group consisting of Co, Fe, Mn, Nb, Os, Ta, U, and V.

3. The method of claim 2, wherein treating the initial film comprises exposing the initial film to an oxidizing environment.

4. The method of claim 3, wherein the expanded film comprises a material selected from the group consisting of CoO, $Fe_2O_3$, $Fe_3O_4$, $MnO_2$, $Mn_2O_3$, $Mn_3O_4$, $MoO_3$, $Nb_2O_5$, $Ta_2O_5$, $OsO_2$, $UO_2$, and $V_2O_5$.

5. The method of claim 4, wherein treating the initial film comprises exposing the initial film to an oxidizing environment.

6. The method of claim 1, wherein the film material has a Pilling-Bedworth ratio of greater than 2.5 and is selected from the group consisting of Mo, Os, and V.

7. The method of claim 6, wherein the expanded film comprises a material selected from the group consisting of $MoO_3$, $OsO_2$ and $V_2O_5$.

8. The method of claim 1, wherein the expanded film comprises a material selected from the group consisting of $CrN_2$, $MoN_2$ and $OsN_2$.

9. The method of claim 1, wherein treating the initial film comprises exposing the initial film to an oxidizing agent comprising one or more of $O_2$, $O_3$, $N_2O$, $H_2O$, $H_2O_2$, CO, $CO_2$, $NH_3$, $N_2/Ar$, $N_2/He$ or $N_2/Ar/He$ and/or a nitridation agent comprising one or more of ammonia, hydrazine, $NO_2$ or nitrogen plasma.

10. The method of claim 1, wherein treating the initial film occurs at a temperature greater than about 300° C.

11. The method of claim 1, wherein the film material comprises a metal selected from the group consisting of Co, Fe, Mn, Nb, Os, Ta, U, and V.

12. A processing method comprising:
providing a substrate surface having at least one trench, the at least one trench extending a depth from the substrate surface to a bottom surface, the at least one trench having a width defined by a first sidewall and a second sidewall;
selectively depositing a film material to form an initial film having a film material volume in the trench and not on the substrate surface, the film material having a Pilling-Bedworth ratio of greater than 2 and comprising a material selected from the group consisting of Cr, Mo and Os; and
treating the initial film to form a nitride of a metal selected from the group consisting of Cr, Mo and Os to expand the film material volume to provide an expanded film which extends beyond the substrate surface.

13. The method of claim 12, wherein the expanded film comprises a material selected from the group consisting of $CrN_2$, $MoN_2$ and $OsN_2$.

14. A processing method comprising:
providing a substrate surface having at least one trench, the at least one trench extending a depth from the substrate surface to a bottom surface, the at least one trench having a width defined by a first sidewall and a second sidewall;
selectively depositing a film material to form an initial film having a film material volume in the trench and not on the substrate surface, the film material having a Pilling-Bedworth ratio of greater than 2 and comprising a material selected from the group consisting of Co, Cr, Fe, Mn, Nb, Os, Ta, U, and V; and
treating the initial film at a temperature less than about 400° C. to form a oxide of a metal selected from the group consisting of Co, Cr, Fe, Mn, Nb, Os, Ta, U, or V to expand the film material volume to provide an expanded film which extends beyond the substrate surface.

15. The method of claim 14, wherein the expanded film comprises a material selected from the group consisting of $MoO_3$, $OsO_2$ and $V_2O_5$.

16. The method of claim 14, wherein treating the initial film occurs at a temperature less than about 350° C.

* * * * *

UNITED STATES PATENT AND TRADEMARK OFFICE
CERTIFICATE OF CORRECTION

PATENT NO. : 10,319,636 B2
APPLICATION NO. : 15/801949
DATED : June 11, 2019
INVENTOR(S) : Basu et al.

Page 1 of 1

It is certified that error appears in the above-identified patent and that said Letters Patent is hereby corrected as shown below:

In the Specification

In Column 3, Line 53, replace "$V_{nitride}N_{metal}$" with "$V_{nitride} / V_{metal}$".

Signed and Sealed this
Sixth Day of August, 2019

Andrei Iancu
*Director of the United States Patent and Trademark Office*